(12) United States Patent
Zhang et al.

(10) Patent No.: US 10,546,956 B2
(45) Date of Patent: Jan. 28, 2020

(54) FIN FIELD EFFECT TRANSISTOR (FINFET) DEVICE AND METHOD FOR FORMING THE SAME

(71) Applicant: Taiwan Semiconductor Manufacturing Company, Ltd., Hsinchu (TW)

(72) Inventors: Zhe-Hao Zhang, Hsinchu (TW); Tung-Wen Cheng, New Taipei (TW); Che-Cheng Chang, New Taipei (TW); Yung-Jung Chang, Cyonglin Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/230,894

(22) Filed: Dec. 21, 2018

(65) Prior Publication Data

US 2019/0123205 A1     Apr. 25, 2019

Related U.S. Application Data

(60) Division of application No. 14/609,088, filed on Jan. 29, 2015, now Pat. No. 10,164,109, which is a
(Continued)

(51) Int. Cl.
*H01L 29/78*     (2006.01)
*H01L 29/66*     (2006.01)
(Continued)

(52) U.S. Cl.
CPC .... *H01L 29/7851* (2013.01); *H01L 21/30604* (2013.01); *H01L 21/31116* (2013.01);
(Continued)

(58) Field of Classification Search
CPC ............... H01L 29/7851; H01L 29/785; H01L 21/31116; H01L 27/0886;
(Continued)

(56) References Cited

U.S. PATENT DOCUMENTS 7,692,254 B2  4/2010  Anderson et al.
7,755,104 B2  7/2010  Yagishita
(Continued)

FOREIGN PATENT DOCUMENTS

CN     102832236 A    12/2012
CN     103247535 A     8/2013
(Continued)

*Primary Examiner* — Victor A Mandala
(74) *Attorney, Agent, or Firm* — Slater Matsil, LLP

(57) ABSTRACT

A fin field effect transistor (FinFET) device structure and method for forming the FinFET device structure are provided. The FinFET structure includes a substrate, and the substrate includes a core region and an I/O region. The FinFET structure includes a first etched fin structure formed in the core region, and a second etched fin structure formed in the I/O region. The FinFET structure further includes a plurality of gate stack structures formed over the first etched fin structure and the second etched fin structure, and a width of the first etched fin structure is smaller than a width of the second etched fin structure.

20 Claims, 12 Drawing Sheets

Related U.S. Application Data continuation-in-part of application No. 14/517,209, filed on Oct. 17, 2014, now Pat. No. 10,164,108.

(60) Provisional application No. 62/075,015, filed on Nov. 4, 2014.

(51) Int. Cl.

| | | |
|---|---|---|
| *H01L 21/762* | (2006.01) | |
| *H01L 21/306* | (2006.01) | |
| *H01L 29/165* | (2006.01) | |
| *H01L 21/8234* | (2006.01) | |
| *H01L 29/08* | (2006.01) | |
| *H01L 27/088* | (2006.01) | |
| *H01L 21/311* | (2006.01) | |

(52) U.S. Cl.
CPC ............ *H01L 21/76224* (2013.01); *H01L 21/823412* (2013.01); *H01L 21/823431* (2013.01); *H01L 21/823481* (2013.01); *H01L 27/0886* (2013.01); *H01L 29/0847* (2013.01); *H01L 29/165* (2013.01); *H01L 29/6653* (2013.01); *H01L 29/66795* (2013.01); *H01L 29/785* (2013.01); *H01L 29/7848* (2013.01)

(58) Field of Classification Search
CPC ..... H01L 21/823431; H01L 21/823412; H01L 21/21; H01L 21/823481; H01L 29/165; H01L 29/7848; H01L 29/6653; H01L 29/0847; H01L 21/30604; H01L 21/76224; H01L 29/66795
See application file for complete search history.

(56) References Cited

U.S. PATENT DOCUMENTS

| | | | |
|---|---|---|---|
| 7,799,592 B2 | 9/2010 | Lochtefeld | |
| 7,985,633 B2 | 7/2011 | Cai et al. | |
| 8,264,021 B2 | 9/2012 | Lai et al. | |
| 8,669,607 B1 | 3/2014 | Tsair et al. | |
| 8,796,093 B1 | 8/2014 | Cheng et al. | |
| 8,890,207 B2 | 11/2014 | Wu et al. | |
| 8,980,701 B1 | 3/2015 | Lu et al. | |
| 9,171,925 B2 | 10/2015 | Kuo et al. | |
| 9,337,285 B2 | 5/2016 | Wann et al. | |
| 9,391,200 B2 | 7/2016 | Liu et al. | |
| 2005/0239254 A1 | 10/2005 | Chi et al. | |
| 2007/0176253 A1 | 8/2007 | Wang et al. | |
| 2008/0132077 A1* | 6/2008 | Morishima | H01L 21/02057 438/704 |
| 2012/0319211 A1 | 12/2012 | van Dal et al. | |
| 2013/0049068 A1 | 2/2013 | Lin et al. | |
| 2013/0084708 A1 | 4/2013 | Jain et al. | |
| 2013/0095616 A1 | 4/2013 | Tsai et al. | |
| 2013/0122676 A1 | 5/2013 | Jeng | |
| 2013/0200455 A1 | 8/2013 | Lo et al. | |
| 2013/0221443 A1* | 8/2013 | Lin | H01L 27/0924 257/368 |
| 2013/0228865 A1 | 9/2013 | Lin et al. | |
| 2013/0270559 A1 | 10/2013 | Hafez et al. | |
| 2013/0285153 A1* | 10/2013 | Lee | H01L 21/02532 257/369 |
| 2013/0313619 A1 | 11/2013 | Fumitake | |
| 2014/0011341 A1 | 1/2014 | Maszara et al. | |
| 2014/0035066 A1 | 2/2014 | Tsai et al. | |
| 2014/0065782 A1 | 3/2014 | Lu et al. | |
| 2014/0106528 A1 | 4/2014 | Quyang et al. | |
| 2014/0117455 A1 | 5/2014 | Liu et al. | |
| 2014/0167264 A1 | 6/2014 | Besser et al. | |
| 2014/0252489 A1 | 9/2014 | Yu et al. | |
| 2014/0361373 A1 | 12/2014 | Hung et al. | |
| 2014/0363935 A1 | 12/2014 | Fu et al. | |
| 2014/0374840 A1* | 12/2014 | Lee | H01L 21/82385 257/401 |
| 2015/0035023 A1 | 2/2015 | Kim et al. | |
| 2015/0214366 A1 | 7/2015 | Chang et al. | |
| 2015/0255352 A1 | 9/2015 | Chuang et al. | |
| 2015/0255543 A1 | 9/2015 | Cheng et al. | |
| 2015/0255576 A1 | 9/2015 | Liao et al. | |
| 2015/0270263 A1 | 9/2015 | Zhu | |
| 2015/0294969 A1* | 10/2015 | Lee | H01L 27/0886 257/401 |
| 2015/0372140 A1 | 12/2015 | Liu et al. | |
| 2016/0049399 A1* | 2/2016 | Park | H01L 29/518 257/327 |
| 2016/0087104 A1 | 3/2016 | Lee et al. | |
| 2016/0225671 A1* | 8/2016 | Olac-Vaw | H01L 29/4966 |
| 2017/0309730 A1 | 10/2017 | Lee et al. | |
| 2018/0122908 A1* | 5/2018 | Balakrishnan | H01L 29/1054 |

FOREIGN PATENT DOCUMENTS

| | | |
|---|---|---|
| CN | 103296084 A | 9/2013 |
| CN | 103426765 A | 12/2013 |
| CN | 103681347 A | 3/2014 |
| CN | 103811345 A | 5/2014 |
| JP | 2007149942 A | 6/2007 |
| JP | 2007294757 A | 11/2007 |
| KR | 1020130091620 A | 8/2013 |
| KR | 20130120973 A | 11/2013 |
| KR | 20140020707 A | 2/2014 |
| KR | 1020140029094 A | 3/2014 |
| KR | 1020140086807 A | 7/2014 |
| KR | 1020140111575 A | 9/2014 |
| TW | I456760 B | 10/2014 |
| TW | I463655 B | 12/2014 |
| TW | I496291 B | 8/2015 |

* cited by examiner

FIN FIELD EFFECT TRANSISTOR (FINFET) DEVICE AND METHOD FOR FORMING THE SAME

PRIORITY CLAIM AND CROSS-REFERENCE

This application is division of U.S. patent application Ser. No. 14/609,088, filed Jan. 29, 2015, and entitled "Fin Field Effect Transistor (FinFET) Device and Method for Forming the Same", which is a Continuation-In-Part of U.S. patent application Ser. No. 14/517,209, filed Oct. 17, 2014 and entitled "Fin field effect transistor (FinFET) device and method for forming the same", and also claims the benefit of U.S. Provisional Application No. 62/075,015 filed Nov. 4, 2014, the entirety of which are incorporated by reference herein. This application is related to the commonly assigned patent application U.S. Ser. No. 14/517,310, filed on Oct. 17, 2014 and entitled "Fin field effect transistor (FinFET) device and method for forming the same", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

Although existing FinFET devices and methods of fabricating FinFET devices have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
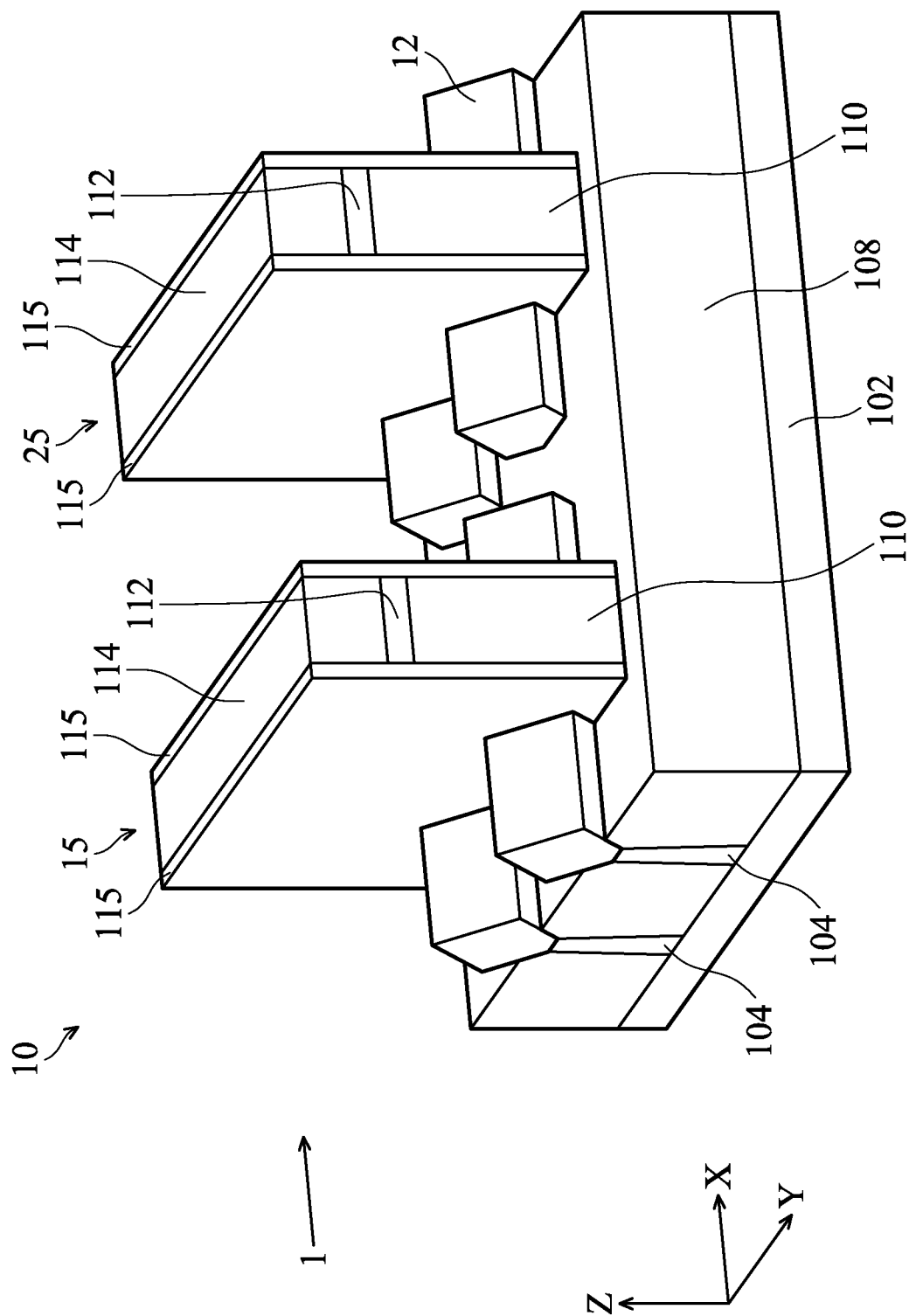
FIG. 1 shows a perspective representation of a fin field effect transistor (FinFET) device structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments for forming a fin field effect transistor (FinFET) device structure are provided. FIG. 1 shows a perspective representation of a fin field effect transistor (FinFET) device structure 10, in accordance with some embodiments of the disclosure. The FinFET device structure 10 includes a N-type FinFET device structure (NMOS) 15 and a P-type FinFET device structure (PMOS) 25.

The FinFET device structure 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide (SiC), gallium arsenic (GaAs), indium arsenide (InAs), or indium phosphide (InP). In some embodiments, the substrate 102 is made of an alloy semiconductor such as silicon germanium (SiGe), silicon germanium carbide (SiGeC), gallium arsenic phosphide (GaAsP), or gallium indium phosphide (GaInP). In some embodiments, the substrate 102 includes an epitaxial layer. For example, the substrate 102 has an epitaxial layer overlying a bulk semiconductor.

The FinFET device structure 10 also includes one or more fin structure 104 (e.g., Si fins) that extend from the substrate 102. The fin structure 104 may optionally include germanium (Ge). The fin structure 104 may be formed by using suitable processes such as photolithography and etching processes. In some embodiments, the fin structure 104 is etched from substrate 102 using dry etch or plasma processes.

In some other embodiments, the fin structure 104 can be formed by a double-patterning lithography (DPL) process. DPL process is a method of constructing a pattern on a substrate by dividing the pattern into two interleaved patterns. DPL process allows enhanced feature (e.g., fin) density.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 1. In other words, a portion of the fin structure 104 is embedded in the isolation structure 108. The isolation structure 108 prevents electrical interference or crosstalk.

The FinFET device structure 10 further includes a gate stack structure including a gate electrode 110 and a gate dielectric layer (not shown). The gate stack structure is formed over a central portion of the fin structure 104. In some other embodiments, multiple gate stack structures are formed over the fin structure 104.

In some other embodiments, the gate stack structure is a dummy gate stack and is replaced later by a metal gate (MG) after high thermal budget processes are performed.

The Gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

The gate electrode 110 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 110 may be formed in a gate last process (or gate replacement process). In some embodiments, the gate stack structure includes additional layers, such as interfacial layers, capping layers, diffusion/barrier layers, or other applicable layers.

The gate stack structure is formed by a deposition process, a photolithography process and an etching process. The deposition process include chemical vapor deposition (CVD), physical vapor deposition (PVD), atomic layer deposition (ALD), high density plasma CVD (HDPCVD), metal organic CVD (MOCVD), remote plasma CVD (RP-CVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process, a wet etching process or a combinations thereof. Alternatively, the photolithography process is implemented or replaced by other proper methods such as maskless photolithography, electron-beam writing, and ion-beam writing.

FIGS. 2A-2F show side views of various stages of forming a fin field effect transistor (FinFET) device structure, in accordance with some embodiments of the disclosure. FIGS. 2A-2F show side views taken along arrow 1 of FIG. 1 and arrow 1 is parallel to the X-axis.

Figure 2A:
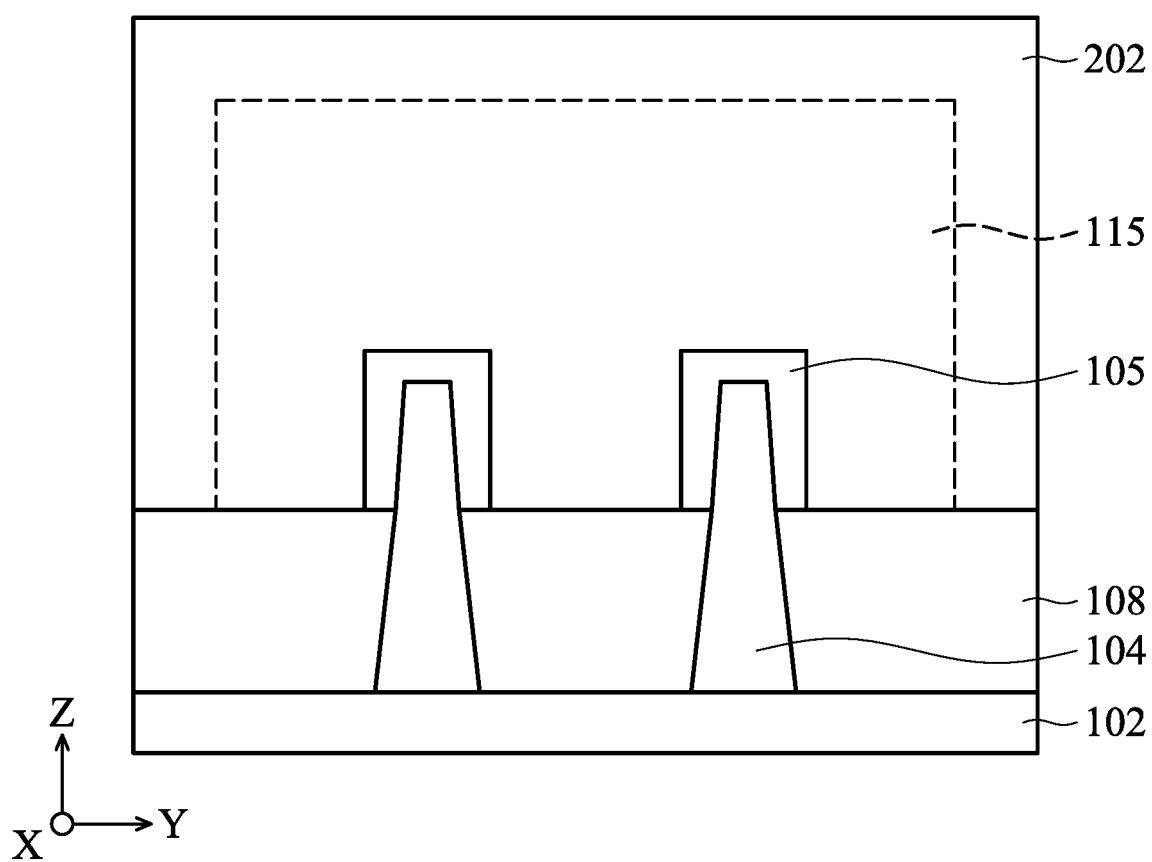
FIGS. 2A-2F show side views of various stages of forming a fin field effect transistor (FinFET) device structure, in accordance with some embodiments of the disclosure.

Referring to FIG. 2A, a first hard mask layer 112 is formed on the gate electrode 110, and a second hard mask layer 114 is formed on the first hard mask layer 112. In some embodiments, the first hard mask layer 112 is made of silicon oxide, silicon nitride, silicon oxynitride, or other applicable materials. In some embodiments, the second hard mask layer 114 is made of silicon oxide, silicon nitride, silicon oxynitride, or other applicable materials.

Gate sidewall spacers 115 are formed on the opposite sidewalls of the gate electrode 110, fin sidewall spacers 105 are formed on the opposite sidewalls of the fin structure 104. The gate sidewall spacers 115 and the fin sidewall spacers 105 independently include dielectric materials, such as silicon oxide, silicon nitride, silicon carbide (SiC), silicon oxynitride, or combinations thereof.

Afterwards, a bottom anti-reflective coating (BARC) layer 202 is formed on the gate sidewall spacers 115. The BARC layer 202 is used under a photoresist layer for enhancing pattern transfer to the hard mask layers 112, 114 during a patterning process. In some embodiments, when an implantation process is performed on N-type FinFET device structure (NMOS) 15, the BARC 202 and a photoresist (not shown) which is formed on the BARC 202 are formed on the gate electrode 110 to cover the gate electrode 110 in the P-type FinFET device structure (PMOS) 25.

Figure 2B:
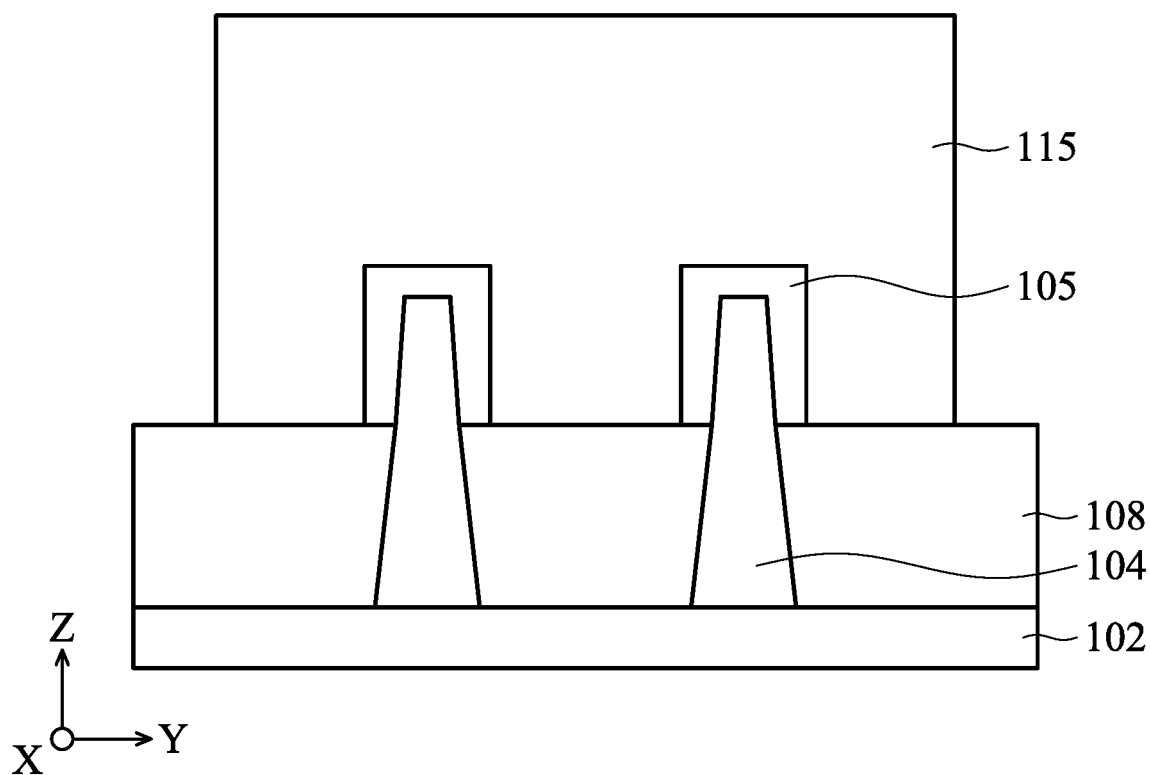

Afterwards, the photoresist (not shown) and BARC 202 are removed by an etching process as shown in FIG. 2B, in accordance with some embodiments of the disclosure. The etching process may be a dry etching process or a wet etching process. In some embodiments, a first dry etching process is operated at a pressure in a range from about 3 mTorr to about 50 mTorr. In some embodiments, the gas used in the first dry etching process includes methane ($CH_4$), nitrogen ($N_2$), helium (He), oxygen ($O_2$) or combinations thereof. In some embodiments, the first dry etching process is operated by a power in a range from about 50 W to about 1000 W. In some embodiments, the first dry etching process is operated at a temperature in range from about 20° C. to about 80° C.

Figure 2C:
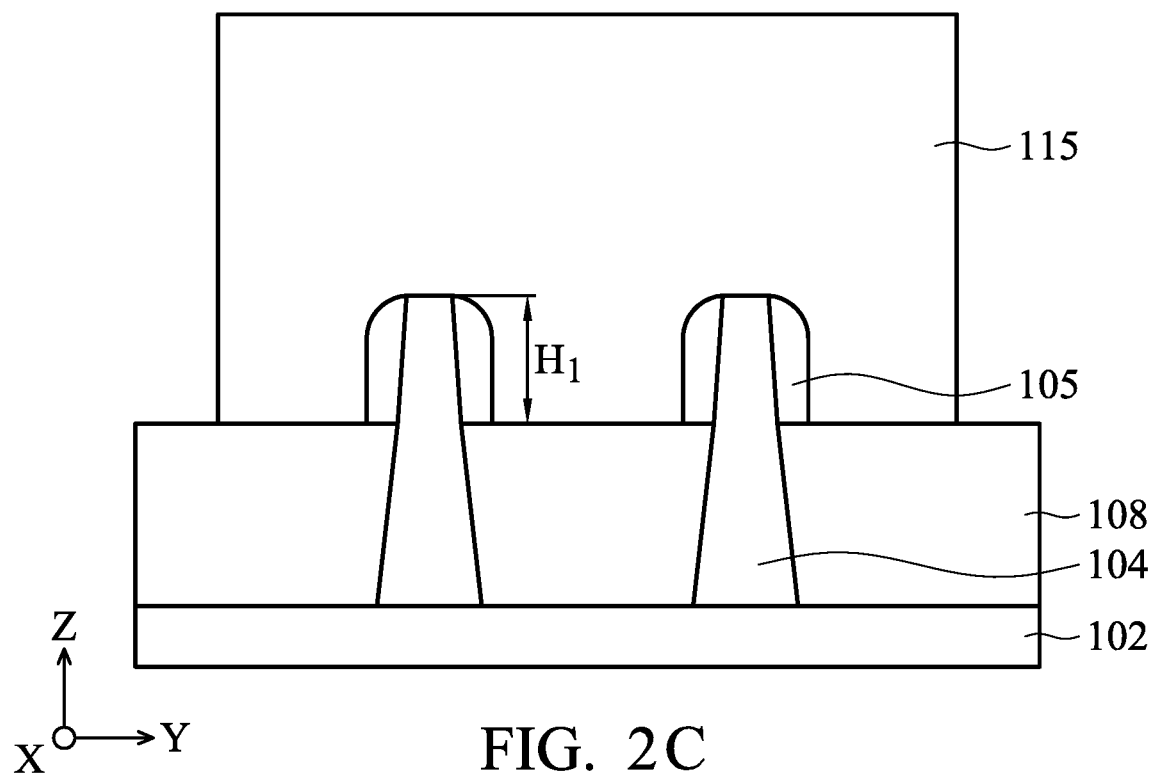

After the BARC 202 is removed, a portion of the gate sidewall spacers 115 and a portion of the fin sidewall spacers 105 are removed as shown in FIG. 2C, in accordance with some embodiments of the disclosure. More specifically, a top portion of the gate sidewall spacers 115 is removed to expose the second hard mask layer 114. A top portion of the fin sidewall spacers 105 is removed to expose the fin structure 104.

In some embodiments, when the gate sidewall spacers 115 and the fin sidewall spacers 105 are made of silicon nitride, a second etching process is performed to remove the silicon nitride. In some embodiments, the second etching process is a second dry etching process and is operated at a pressure in a range from about 3 mTorr to about 50 mTorr. In some embodiments, the gas used in the second dry etching process includes fluoromethane ($CH_3F$), difluoromethane ($CH_2F_2$), methane ($CH_4$), argon (Ar), hydrogen bromide (HBr) nitrogen ($N_2$), helium (He), oxygen ($O_2$) or combinations thereof. In some embodiments, the second dry etching process is operated by power in a range from about 50 W to about 1000 W. In some embodiments, the second dry etching process is operated at a temperature in range from about 20° C. to about 70° C.

After the second dry etching process, each of the fin sidewall spacers 105 has a first height $H_1$. In some embodiments, the first height $H_1$ is in a range from about 0.1 nm to about 50 nm.

Figure 2D:
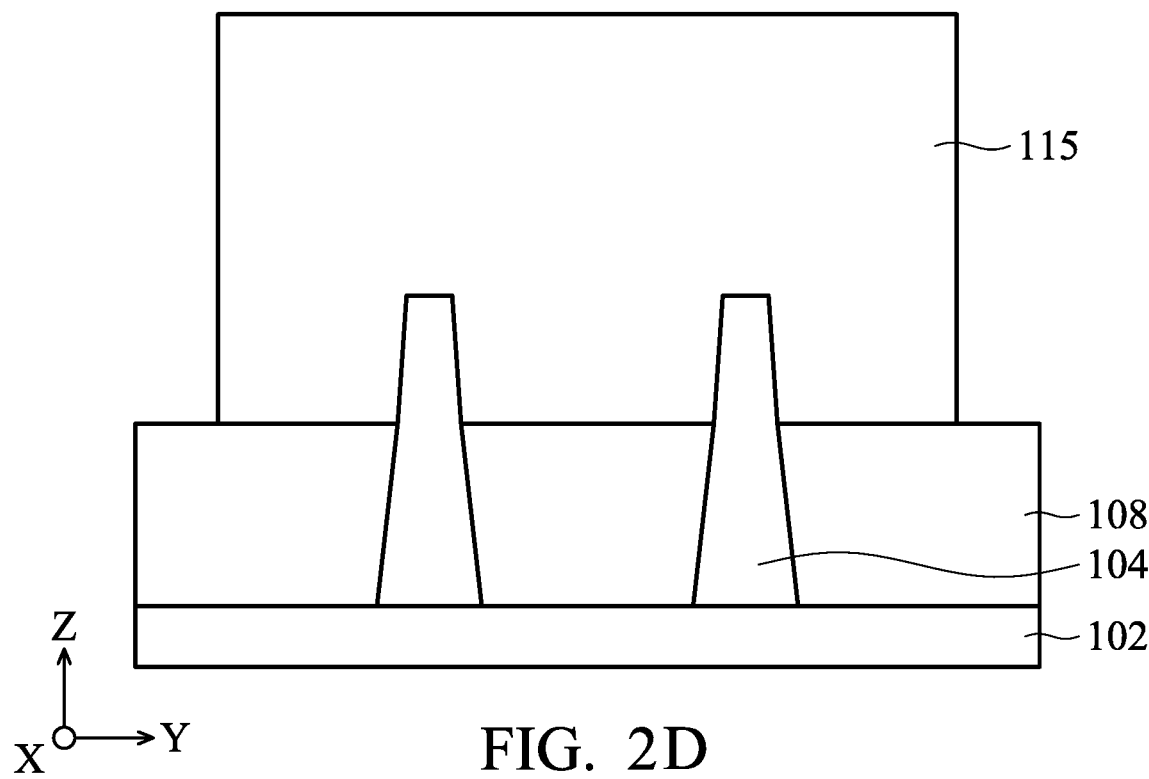

After the portion of the gate sidewall spacers 115 and the portion of the fin sidewall spacers 105 are removed, the remaining fin sidewall spacers 105 are removed as shown in FIG. 2D, in accordance with some embodiments of the disclosure. The fin sidewall spacers 105 are removed by a third etching process. The third etching process may be a dry etching process or a wet etching process.

In some embodiments, the third etching process is a third dry etching process and is operated at a pressure in a range from about 3 mTorr to about 50 mTorr. In some embodiments, the gas used in the third dry etching process includes fluoromethane ($CH_3F$), difluoromethane ($CH_2F_2$), methane ($CH_4$), argon (Ar), hydrogen bromide (HBr) nitrogen ($N_2$), helium (He) or oxygen ($O_2$) or combinations thereof. In some embodiments, the third dry etching process is operated by a power in a range from about 50 W to about 1000 W. In some embodiments, the third dry etching process is operated at a temperature in range from about 20° C. to about 70° C.

Figure 2E:
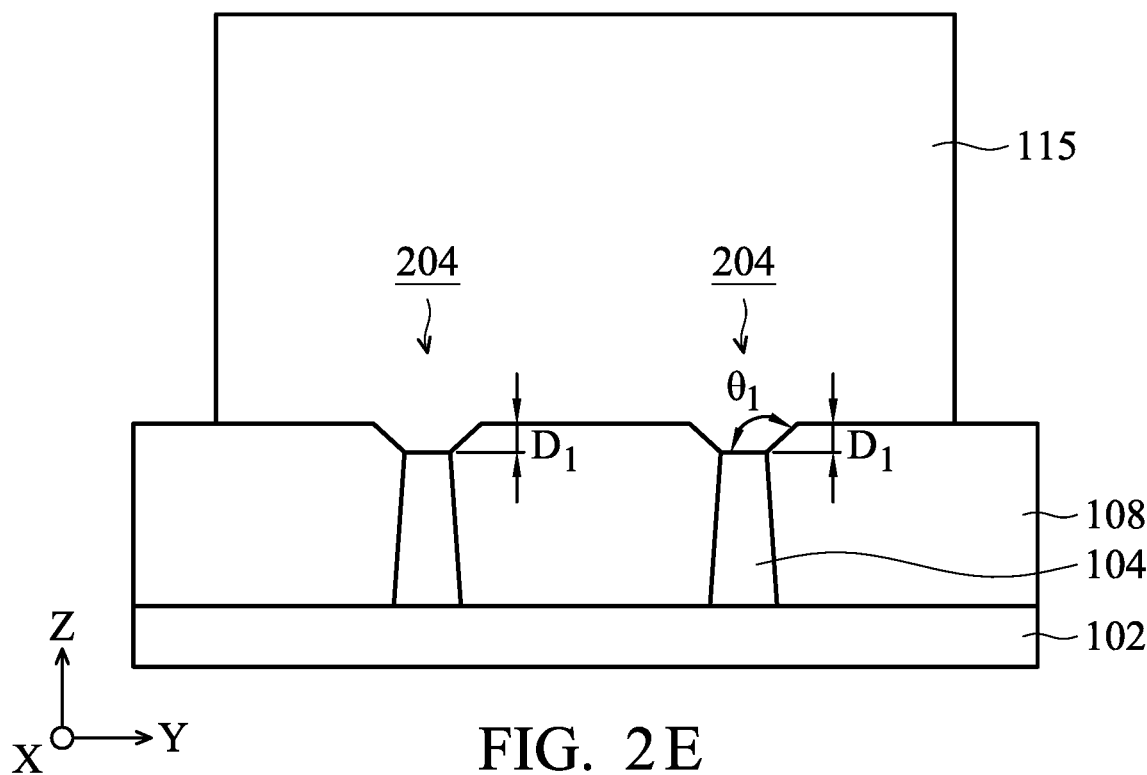
Figure 2F:
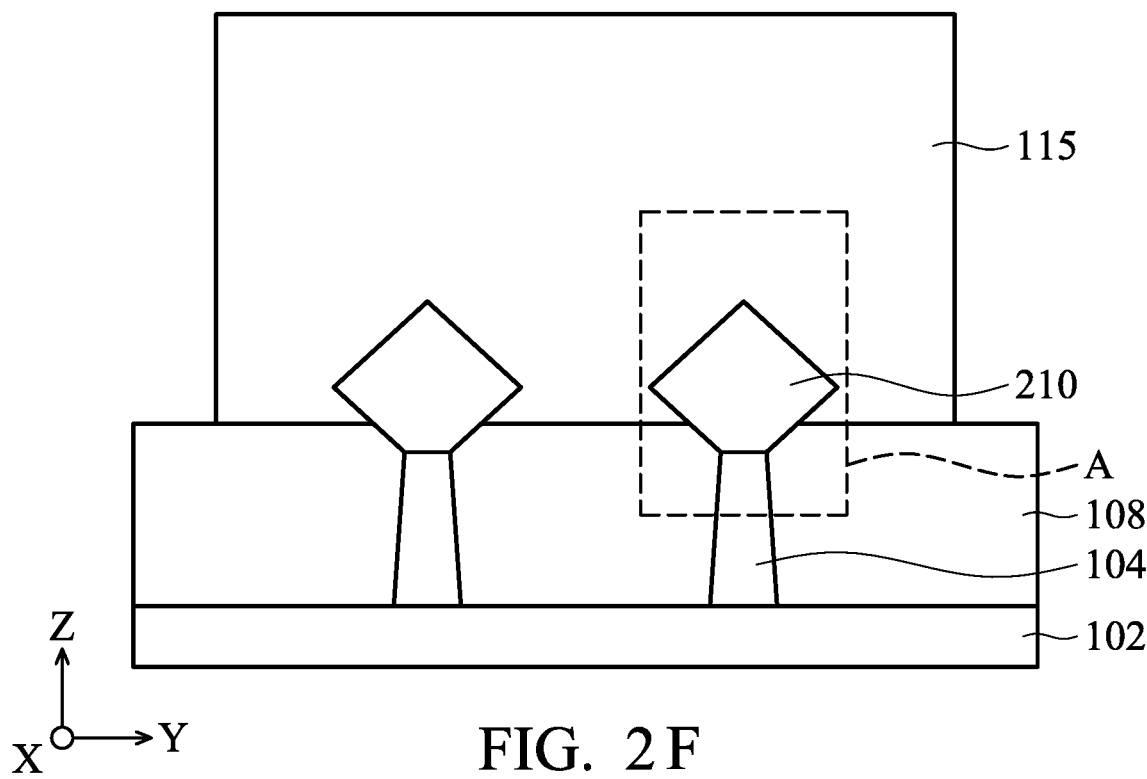

The performance of the FinFET device structure is relative to the volume of an epitaxial structure (such as 210 as shown in FIG. 2F). If the fin sidewall spacers 105 are remaining on the isolation structure, the volume an epitaxial structure (such as 210 as shown in FIG. 2F) will be limited by the fin sidewall spacers 105. In order to obtain a large volume of the epitaxial structure, it should be noted that the overall fin sidewall spacers 105 are removed. In other words, no fin sidewall spacers are formed adjacent to the fin structure 104.

After the third dry etching process, a portion of the fin structure 104 is removed as shown in FIG. 2E, in accordance with some embodiments of the disclosure. Afterwards, a portion of the isolation structure 108 is removed. The fin structure 104 and the isolation structure 108 are independently removed by an etching process, such as a dry etching process or a wet etching process.

As shown in FIG. 2E, a top surface of the remaining fin structure 104 is lower with a top surface of the isolation structure 108. A trench 204 is formed by recessing a portion of the fin structure 104 and the portion of the isolation structure 108. The recessing process includes a dry etching process, a wet etching process or combinations thereof. A wet etching solution used in the wet etching process includes tetramethylammonium hydroxide ($NH_4OH$), potassium hydroxide (KOH), hydrofluoric acid (HF), tetramethylammonium hydroxide (TMAH), another application solution or combinations thereof. The dry etching process includes a biased plasma etching process. In some embodiments, the gas used in the biased plasma etching process includes tetrafluoromethane ($CF_4$), Nitrogen trifluoride ($NF_3$), sulfur hexafluoride ($SF_6$) or helium (He).

It should be noted that the epitaxial structure (such as 210, as shown in FIG. 2F) will be formed in the trench 204, and therefore the size of the trench 204 should be well controlled. The trench 204 has a bottom surface and sloping sidewalls adjoined to the bottom surface. The trench 204 has a depth $D_1$ and an angle $\theta_1$ between the bottom surface and the sidewall. In some embodiments, the depth $D_1$ is in a range from about 0.1 nm to about 50 nm. In some embodiments, the angle $\theta_1$ between the bottom surface and the sidewall of the trench 204 is in a range from about 90 degrees to about 175 degrees. If the angle $\theta_1$ is too great, the epitaxial structure (such as 210, as shown in FIG. 2F) may have too large spacing to grow. If the angle $\theta_1$ is too small, the volume of the epitaxial structure (such as 210, as shown in FIG. 2F) will be restricted by small space, and the epitaxial structure will be smaller. The device mobility of the epitaxial structure will be affected the volume.

After the portion of the fin structure 104 and the portion of the isolation structure 108 are removed, an epitaxial structure 210 is formed on the fin structure 104 as shown in FIG. 2F, in accordance with some embodiments of the disclosure.

The epitaxial structure 210 includes source/drain epitaxial structure. In some embodiments, when an N-type FET (NFET) device is desired, the source/drain epitaxial structures include an epitaxially grown silicon (epi Si). Alternatively, when a P-type FET (PFET) device is desired, epitaxial source/drain structures include an epitaxially growing silicon germanium (SiGe). The epitaxial structure 210 may have a single layer or a multiple layers.

It should be noted that the interface between the epitaxial structure 210 and the fin structure 104 is lower than the top surface of the isolation structure 108. The epitaxial structure 210 is formed in the trench 204 and continually extends upwards to form a pentagon-like shape.

Figure 3:
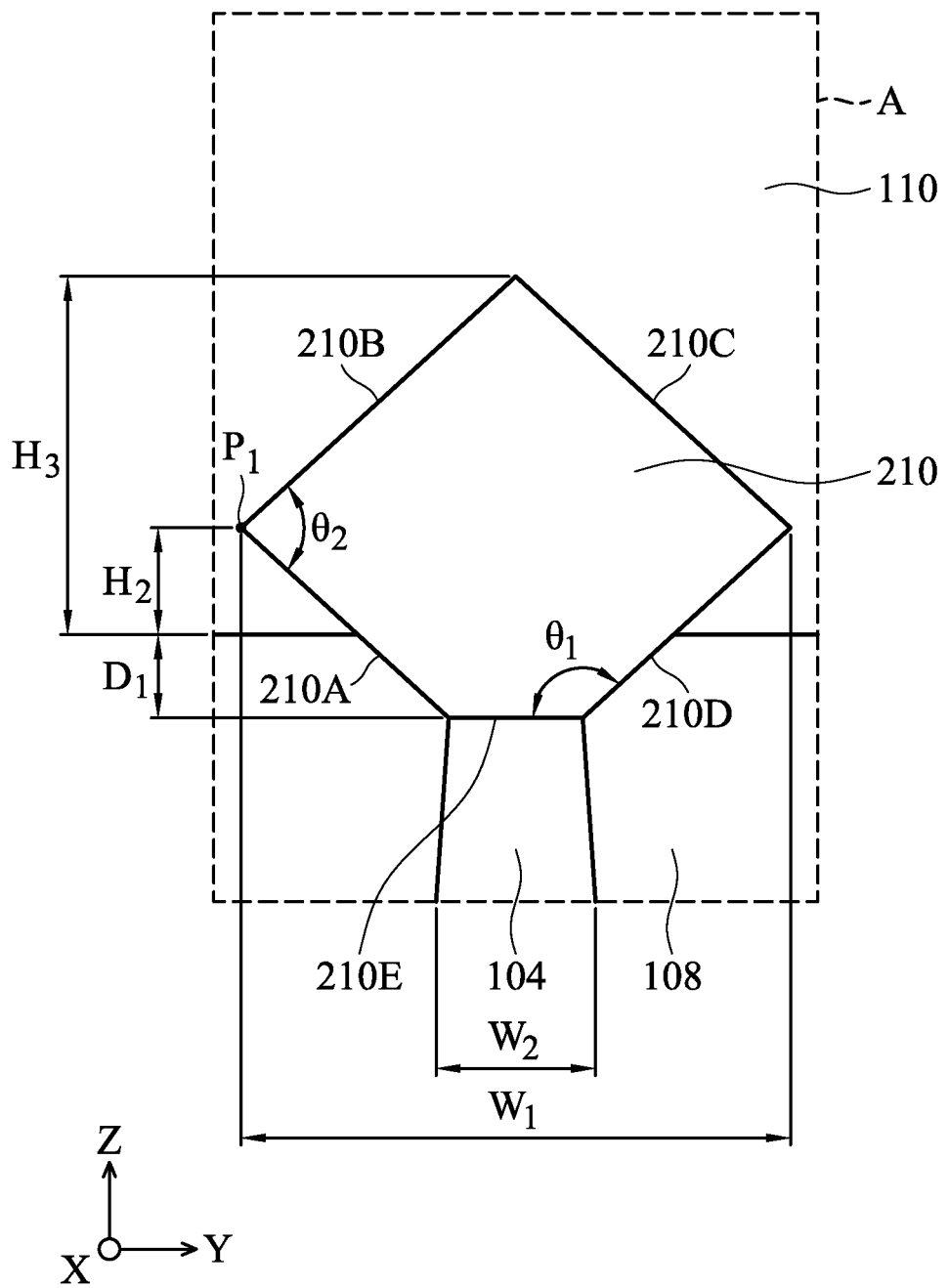
FIG. 3 is an enlarged representation of region A of FIG. 2F, in accordance with some embodiments of the disclosure.

FIG. 3 is an enlarged representation of region A of FIG. 2F, in accordance with some embodiments of the disclosure. As shown in FIG. 3, the epitaxial structure 210 has the pentagon-like shape. The epitaxial structure 210 has a first surface 210A, a second surface 210B, a third surface 210C, a fourth surface 210D and a fifth surface 210E. Each of the first surface 210A, a second surface 210B, a third surface 210C, a fourth surface 210D has a (111) crystallographic orientation.

A first intersection $P_1$ between the first surface 210A and the second surface 210B is higher than a top surface of the isolation structure. A second intersection $P_2$ between the third surface 210C and the fourth surface 210D is higher than a top surface of the isolation structure. The first intersection $P_1$ and the second intersection $P_2$ are substantially in the same level. The first intersection $P_1$ extends from the top surface of the isolation structure 108 to a height $H_2$. In some embodiments, the height $H_2$ is in a range about 0.1 nm to about 50 nm. An angle $\theta_1$ between the fifth surface 210E and the first surface 210A is in a range from about 90 degrees to about 175 degrees. An angle $\theta_2$ between the first surface 210A and the second surface 210B is in a range from 10 degrees to about 175 degrees.

As shown in FIG. 3, the epitaxial structure 210 has a height $H_3$ and a width $W_1$. In some embodiments, the height $H_3$ is in a range from about 1 nm to about 100 nm. If the height $H_3$ is too great, the electric resistance becomes lower. If the height $H_3$ is too small, electric resistance becomes higher to impact device speed. In some embodiments, the width $W_1$ is in a range from about 1 nm to about 100 nm. If the width $W_1$ is too great, the epitaxial structure 210 may merge with neighbor one and cause short circuit effect. If the width $W_1$ is too small, a contact window for contacting with the epitaxial structure 210 will become narrow, and therefore the circuit effect may be broken. The fin structure 104 has a width $W_2$. In some embodiments, the width $W_2$ of the fin structure 104 is smaller than width $W_1$ of the epitaxial structure 210.

In addition, a ratio ($H_3/W_1$) of the height $H_3$ of the epitaxial structure 210 to width $W_1$ of the epitaxial structure 210 is in a range from about 1 to about 100. If the ratio is too great, the epitaxial Si height will be short to affect resistance value. If the ratio is too small, the epitaxial Si volume will be smaller to reduce tension of device. Both of all will impact the mobility of device.

The epitaxial structure 210 includes a single-element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP).

The epitaxial structure 210 is formed by an epi process. The epi process may include a selective epitaxial growth (SEG) process, a chemical vapor deposition (CVD) process (e.g., vapor-phase epitaxy (VPE), a low pressure chemical vapor deposition (LPCVD) and/or ultra-high vacuum CVD (UHV-CVD)), molecular beam epitaxy, another applicable epi processes, or combinations thereof. The formation process of the epitaxial structure 210 may use gaseous and/or liquid precursors, which may interact with the composition of the fin structure 104 thereunder.

The epitaxial structure 210 may be doped or undoped in-situ during the epi process. For example, the epitaxially grown SiGe epitaxial structure may be doped with boron; and the epitaxially grown Si epitaxial structure may be doped with carbon to form a Si:C epitaxial structure, phosphorous to form a Si:P epitaxial structure, or both carbon and phosphorous to form a SiCP epitaxial structure. The doping may be achieved by an ion implantation process, plasma immersion ion implantation (PIII) process, gas and/or solid source diffusion process, another suitable process or combinations thereof. The epitaxial structure 210 may further be exposed to annealing processes, such as a rapid thermal annealing process. The annealing process is used to activate the dopants. The annealing process includes rapid thermal annealing (RTA) and/or laser annealing process.

If the epitaxial structure 210 is not doped in-situ, a second implantation process (i.e., a junction implant process) is performed to dope the epitaxial structure 210.

The fin structure 104 includes a channel region (not shown) surrounded or wrapped by the gate electrode 110. The lattice constants of the epitaxial structure 210 are different from the substrate 102, in that the channel regions are strained or stressed to enable carrier mobility of the FinFET device structure and enhance the FinFET device structure performance.

Afterwards, The FinFET device structure may continue to undergo other processes to form other structures or devices. In some embodiments, metallization includes vertical interconnects, such as conventional vias or contacts, and horizontal interconnects, such as metal lines. The various interconnection features may implement various conductive materials including copper, tungsten, and/or silicide.

The performance of the FinFET device structure is relative to the volume of the epitaxial structure 210. If the volume of the epitaxial structure 210 is too small, the operation speed of the FinFET device structure is too small to meet the requirement.

As mentioned above, if the fin sidewall spacers 105 are remaining on the isolation structure 108, the growth volume of the epitaxial structure is limited by the fin sidewall spacers 105. In order to obtain a large volume of the epitaxial structure, the fin sidewall spacers 105 are completely removed. In addition, a portion of the isolation structure 108 is removed to enlarge the width of the trench 204. It should be noted that the trench 204 is designed to have a depth $D_1$ and angle $\theta_1$, and therefore the epitaxial structure 210 has more space to grow or be extended.

It should be noted that the volume and the height $H_1$ of the epitaxial structure 210 are controlled by adjusting the depth $D_1$ and angle $\theta_1$ of the trench 204. Once the volume and the heights $H_1$ of the epitaxial structure 210 are controlled well, the performance of the FinFET device structure is further improved. More specifically, the operation speed of the FinFET device structure is further increased. In addition, the resistance of the gate electrode 110 may be reduced.

Figure 4:
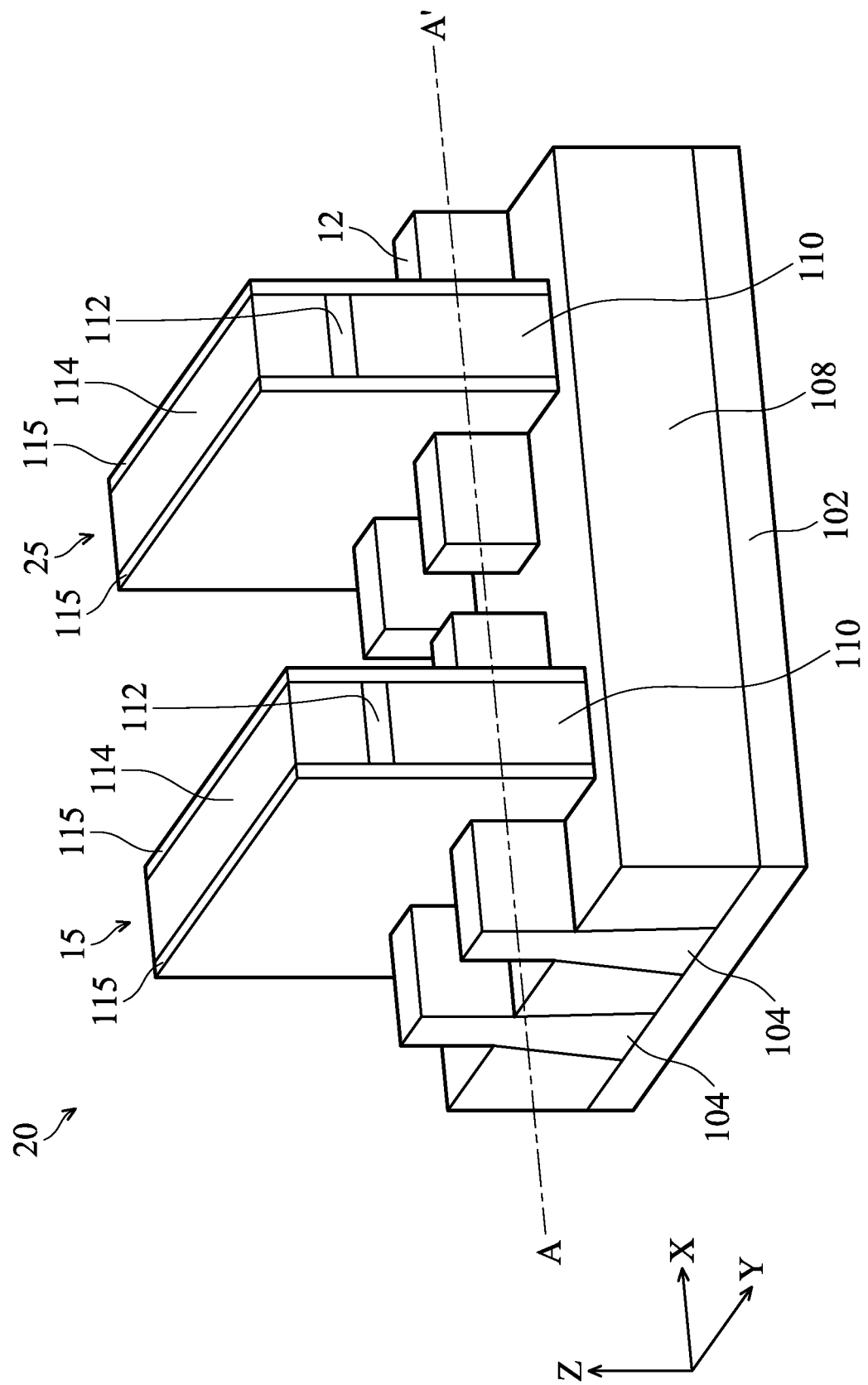
FIG. 4 shows a perspective representation of a fin field effect transistor (FinFET) device structure, in accordance with some embodiments of the disclosure.
Figure 5A:
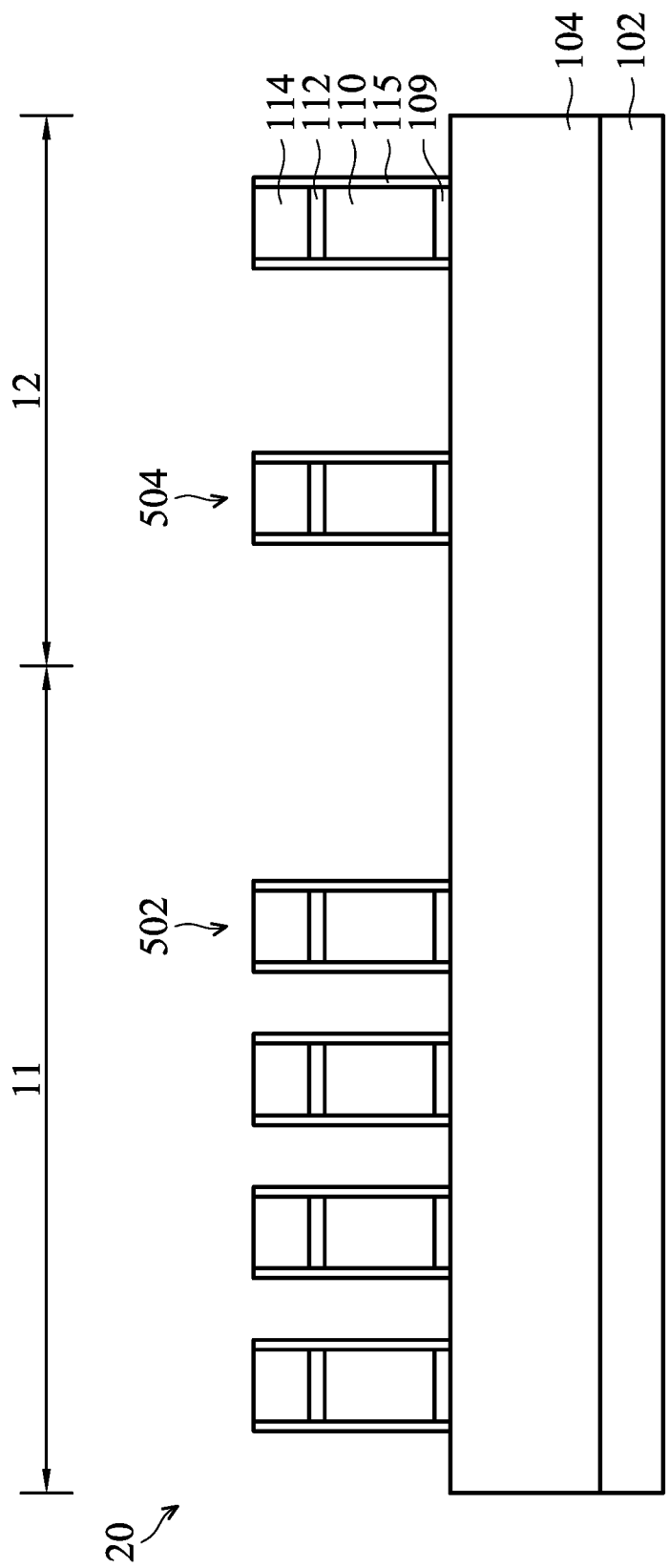
FIGS. 5A-5C are cross-sectional representations taken along AA' line of FIG.
Figure 5B:
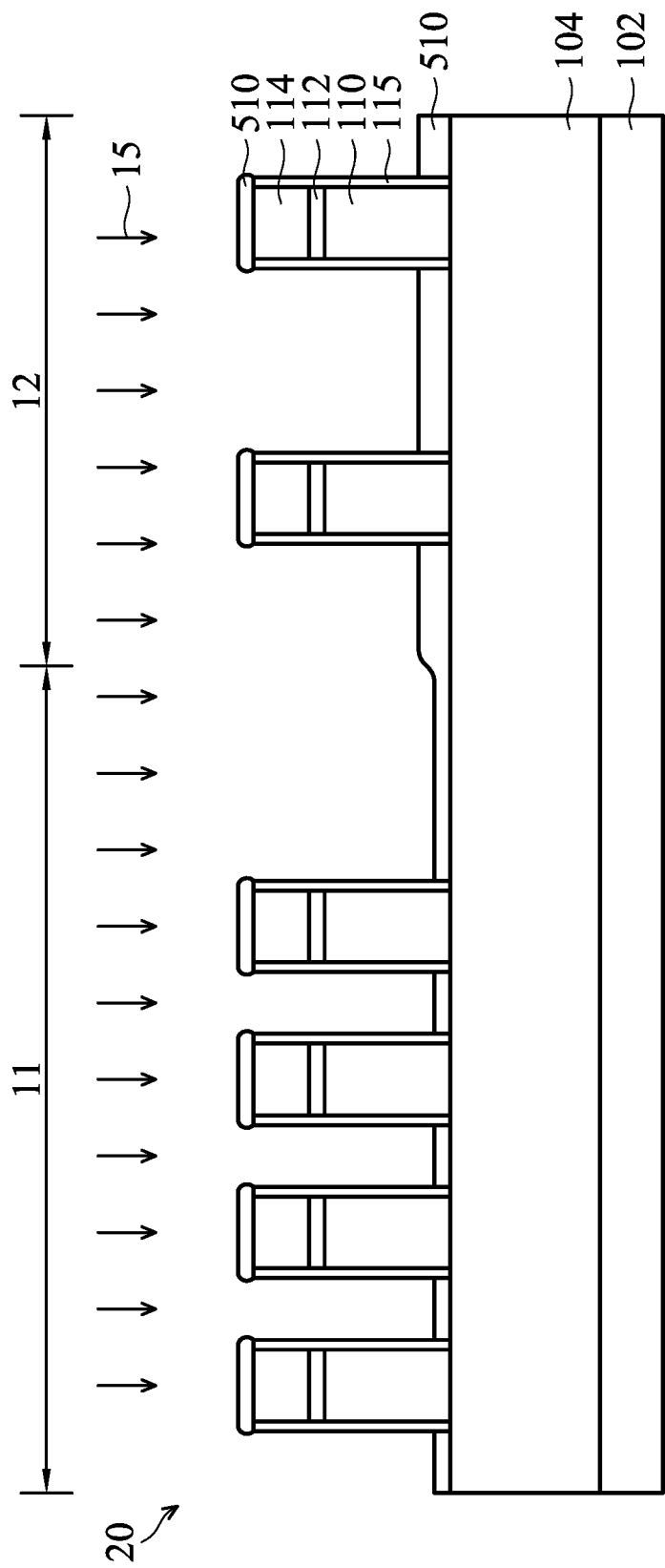
Figure 5C:
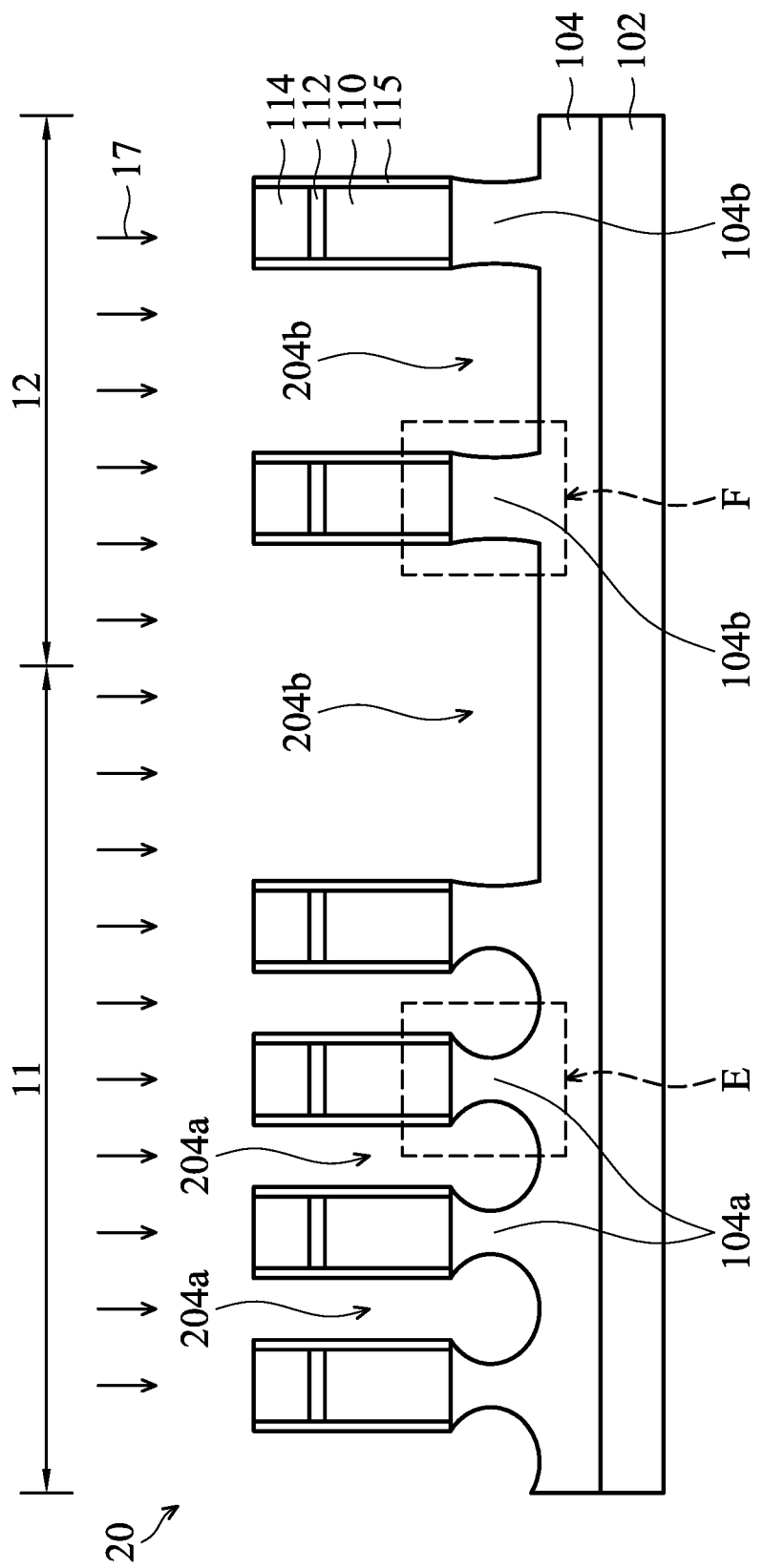

FIG. 4 shows a perspective representation of a fin field effect transistor (FinFET) device structure 20, in accordance with some embodiments of the disclosure. FIGS. 5A-5C are cross-sectional representations taken along AA' line of FIG. 4.

A number of fin structures 104 are formed on the substrate 102. The isolation structure 108 is formed on the substrate 102, and the fin structures 104 are embedded in the isolation structure 108. Also shown is a source/drain region 12 formed in a fin structure 104.

Referring to FIG. 5A, the substrate 102 includes a core region 11 and an I/O region 12. A number of first gate stack structures 502 are formed in the core region 11, and a number of second gate stack structures 504 are formed in the I/O region 12. It should be noted the pattern density in the core region 11 is different from that in the I/O region 12. More specifically, the pattern density of the first gate stack structures 502 in the core region 11 is greater than the pattern density of the second gate stack structures 504 in the I/O region 12.

Each of the first gate stack structures 502 or second gate stack structures 504 has a gate dielectric layer 109, the gate electrode 110, the first hard mask layer 112 and the second hard mask layer 114. The gate sidewall spacers 115 are formed on opposite sidewalls of the gate electrode 110.

After the first gate stack structures 502 and the second gate stack structures 504 are formed, a deposition process 15 is performed on the first gate stack structures 502 and the second gate stack structures 504 as shown in FIG. 5B, in accordance with some embodiments of the disclosure.

The deposition process 15 includes using a deposition gas. Therefore, a film 510 is formed on the top surface of the first gate stack structures 502 and the second gate stack structures 504, and on the top surface of the fin structure 104. In some embodiments, the deposition gas includes $C_xH_y$, such as methane gas ($CH_4$) or acetylene gas ($C_2H_2$). In some embodiments, the film 510 is made of copolymer.

"Loading effect" means that the deposition rate is not the same among different pattern densities. More specifically, the loading effect is caused by the difference of the pattern density between the core region 11 and the I/O region 12. As shown in FIG. 5B, the loading effect occurs, and therefore the thickness of the film 510 in the I/O region 12 is greater than that in the core region 11.

After forming the film 510 on the fin structure 104, a portion of the fin structure 104 is removed as shown in FIG. 5C, in accordance with some embodiments of the disclosure. The top portion of the fin structure 104 is recessed by an etching process 17 to form a number of first trenches 204a and a number of second trenches 204b (like trench 204 shown in FIG. 2E). A first etched fin structure 104a is formed between two adjacent first trenches 204a. A second etched fin structure 104b is formed between two adjacent trenches 204b.

In some embodiments, the etching process 17 includes using a halogen-containing gas, such as $CF_4$, $CH_2F_2$, $SF_6$, $NF_3$, $Cl_2$ or combinations thereof.

Afterwards, the epitaxial structure (not shown, like epitaxial structure 210 in FIG. 2F) is formed in the first trenches 204a and the second trenches 204b. The epitaxial structure is formed in the first trenches 204a and the second trenches 204b and continually extends upwards to form a pentagon-like shape. An interface between the epitaxial structure and the fin structure 104 is lower than the top surface of the isolation structure 108.

Figure 6A:
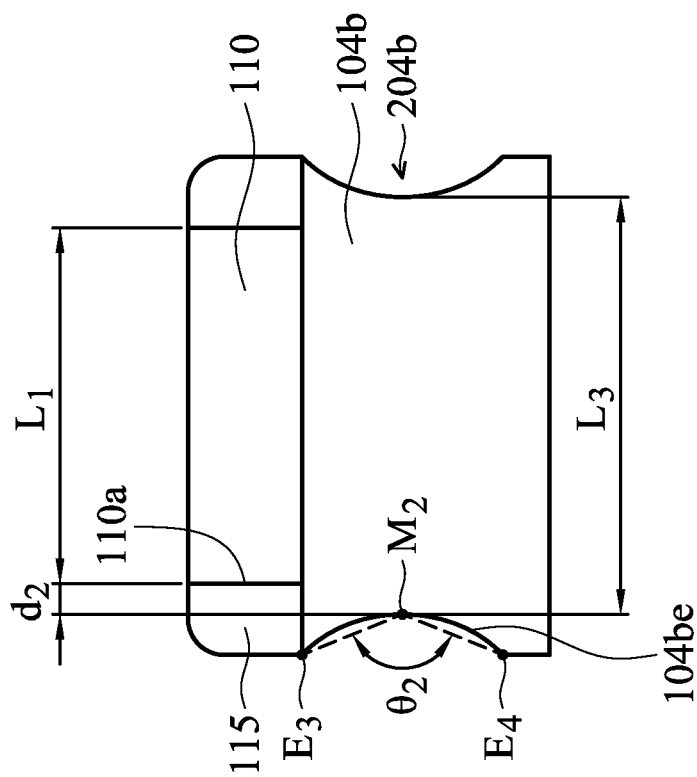
FIG. 6A is an enlarged representation of region E of FIG. 5C, in accordance with some embodiments of the disclosure.

FIG. 6A is an enlarged representation of region E of FIG. 5C, in accordance with some embodiments of the disclosure.

As shown in FIG. 6A, after the etching process 17, the gate electrode 110 has a first length $L_1$, and a narrowest portion of the first etched fin structure 104a below the gate electrode 110 has a second length $L_2$.

A first proximity distance $d_1$ is defined as the horizontal distance between the left edge 110a of the gate electrode 110 and the left edge 104a of the first etched fin structure 104a. Alternatively, the first proximity distance d1 can also be defined as the distance between the edge of the gate electrode 110 and a narrowest portion of the first etched fin structure 104a. In other words, the first proximity distance $d_1$ is defined by a distance between the edge of the gate electrode 110 and a widest portion of the first trenches 204a. Alternatively, the first proximity distance $d_1$ is defined by a distance between the right edge of the gate electrode 110 and the right edge of the first etched fin structure 104a.

Furthermore, a first proximity distance value is a mean (or average) of the difference between the first length $L_1$ and the second length $L_2$, and the second length $L_2$ minus the first length $L_1$ is the difference. The first proximity distance value is calculated by the following formula (I).

$$\text{The first proximity distance value}=(L2-L1)/2 \qquad \text{formula (I).}$$

As shown in FIG. 6A, the second length $L_2$ is shorter than the first length $L_1$, and therefore the proximity distance value is less than zero. In some embodiments, the proximity distance value in the core region 11 is in a range from about 0 to about −50 nm.

Furthermore, the first trenches 204a have a curved sidewall in FIG. 6A. The curved sidewall has an upper sidewall portion having a first slope and a lower sidewall portion having a second slope. An angle $\theta_1$ is between the first slope and the second slope. In some embodiments, a point $E_1$ and a point $E_2$ are end-points of the curved sidewall, and a point $M_1$ is between point $E_1$ and $E_2$. The intersection point $M_1$ is used to define the first slope and the second slope. The first slope is formed from the point $M_1$ to the point $E_1$, and the second slope is formed from the point the $M_1$ to the point $E_2$. In some embodiments, the angle $\theta_1$ is in a range from about 90 degrees to about 180 degrees.

Figure 6B:
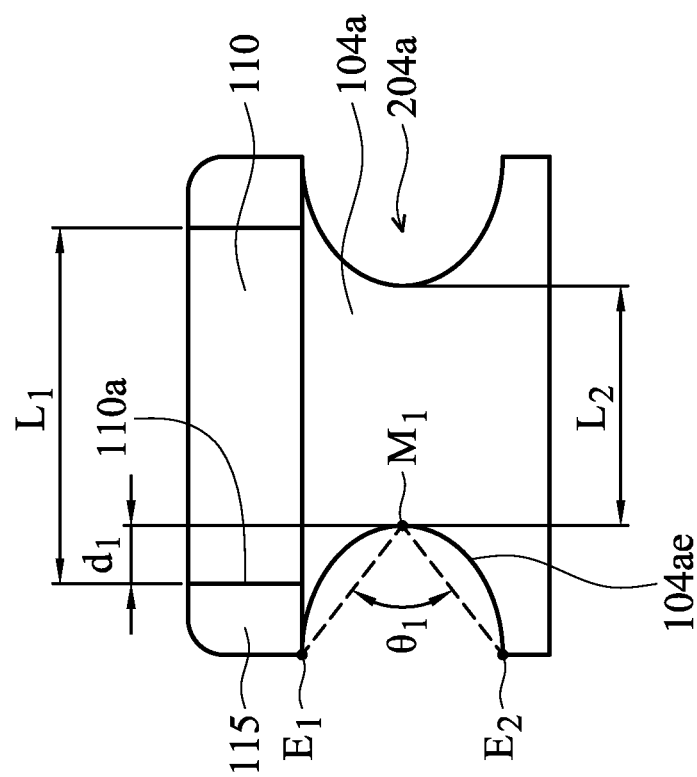
FIG. 6B is an enlarged representation of region F of FIG. 5C, in accordance with some embodiments of the disclosure.

FIG. 6B is an enlarged representation of region F of FIG. 5C, in accordance with some embodiments of the disclosure. A narrowest portion of the second etched fin structure 104b below the gate electrode 110 has a third length $L_3$.

A second proximity distance $d_2$ is defined by a distance between the left edge 110a of the gate electrode 110 and the left edge 104 be of the second etched fin structure 104b. Alternatively, the second proximity distance $d_2$ is defined by a distance between the edge of the gate electrode 110 and a narrowest portion of the second etched fin structure 104b. In other words, the second proximity distance $d_2$ is defined by a distance between the edge of the gate electrode 110 and a widest portion of the second trenches 204b.

A second proximity distance value is a mean (or average) of a difference between the first length $L_1$ and the third length $L_3$, and the third length $L_3$ minus the first length $L_1$ is the difference. The proximity distance value is calculated by the following formula (II).

$$\text{The second proximity distance value}=(L3-L1)/2 \qquad \text{formula (II).}$$

As shown in FIG. 6B, the third length $L_3$ is greater than the first length $L_1$, and therefore the second proximity distance value is greater than zero. In some embodiments, the second proximity distance value in the core region 11 is in a range from about 0 to about 50 nm.

Furthermore, the trench 204b has a curved sidewall in FIG. 6B. The curved sidewall has an upper sidewall portion having a first slope and a lower sidewall portion having a second slope. An angle $\theta_2$ is between the first slope and the second slope. In some embodiments, a point $E_3$ and a point $E_4$ are end-points of the curved sidewall, and a point $M_2$ is between the point $E_1$ and the point $E_2$. The intersection point $M_2$ is used to define the first slope and the second slope. The first slope is formed from the point $M_2$ to the point $E_3$, and the second slope is formed from the point $M_2$ to the point $E_4$. In some embodiments, the angle $\theta_2$ is in a range from about 90 degrees to about 180 degrees.

It should be noted that the film 510 is formed on the fin structure 104, and therefore when the etching process 17 is performed, the film 510 is etched first. In addition, the film 510 is thicker on the fin structure 104 in the I/O region 12 than in the core region 11. The film 510 is used as a sacrificial layer to prevent the fin structure 104 in the I/O region 12 from being over-etched. The amount of etching the fin structure 104 in the core region 11 is greater than that in the I/O region 12. As a result, the proximity distance value in the core region 11 is smaller than zero, and the proximity distance value in the core region 12 is greater than zero. When a negative proximity distance value is obtained in the core region 11, the gate leakage current ($I_{gi}$) of the first gate stack structures 502 is improved. When a positive proximity distance value is obtained in the I/O region 12, the breakdown voltage ($V_{bd}$) of the second gate stack structures 504 is improved.

Figure 7:
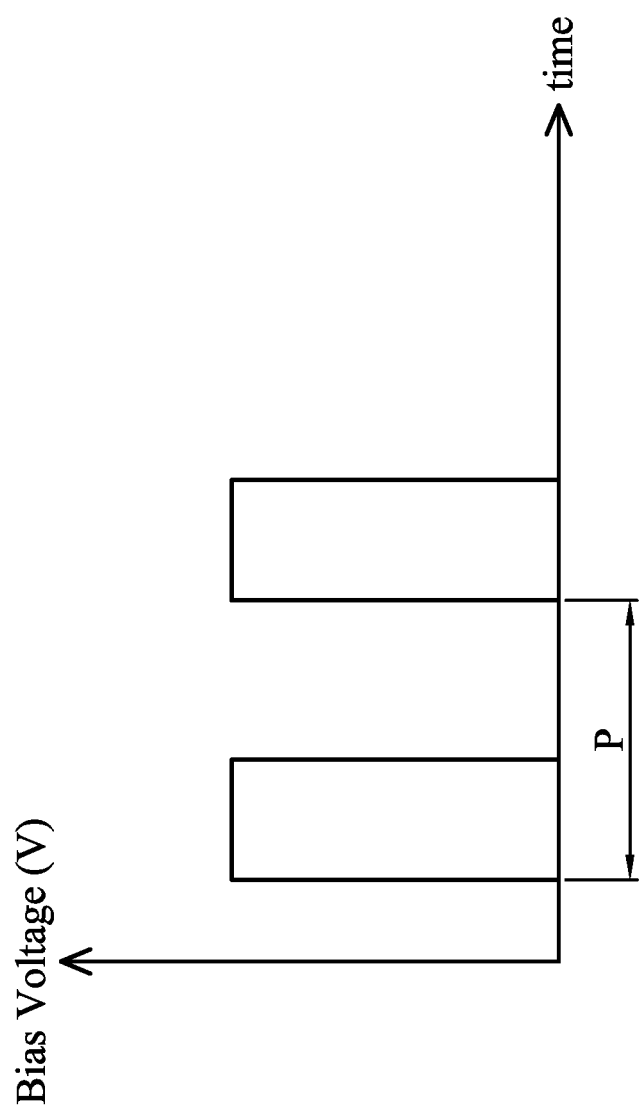
FIG. 7 shows the relationship between time and bias voltage of the high-voltage bias pulsing method.

In some embodiments, during the etching process 17, a "high-voltage bias pulsing method" is performed. FIG. 7 shows the relationship between time and bias voltage of the high-voltage bias pulsing method. The high bias voltage (or "on" state) and zero voltage (or "off" state) are sequentially applied to the fin structure 104 while the etching process is being performed 17. A pulse P is defined as a set of high bias voltage and zero voltage.

In some embodiments, the pulse frequency is in a range from about 100 Hz to about 900 Hz. If the pulse frequency is too high, the etching rate may be lost for the etching process. If the pulse frequency is too low, the loading effect may become obvious. In some embodiments, the pulse voltage is in a rage from about 5 V to about 1000 V. If the pulse voltage is too high, the etching rate may be too faster and thus selectivity may be lost. If the pulse voltage is too low, the etching rate will be too slow, and thus etching time is elongated.

It should be noted that some by-products (such as copolymer) may be formed in the bottom portion of the trench 204 a, 204b during the etching process 17. When the bias voltage is in the "on" state, the by-product continues to accumulate on the bottom portion of the trenches 204 a, 204b. Therefore, the etching path is blocked and the uniformity of the trench 204 a, 204b is bad. In order to resolve this problem, a zero bias voltage (or "off" state) is applied after the high bias voltage. When the bias voltage is in the "off" state, the by-product has a chance to be removed, so that it does not accumulate on the bottom of the trench. As a result, the uniformity of the depth of the first trench 204b in the core region 11 and the trenches 204a is improved by the high-voltage bias pulsing method. In addition, the uniformity of the depth of the second trench 204b in the I/O region 12 is improved by the high-voltage bias pulsing method.

In some embodiments, the disclosure provides a method for forming different proximity distance value in the core region 11 and I/O region 12. A deposition process is performed before the etching process, and therefore the film 510 is formed on the fin structure 104. The film 510 has a different thickness in the core region 11 and I/O region 12 due to the loading effect. In some embodiments, by forming a thicker film 510 over the fin structure 104 in the I/O region 12, not too much of the fin structure 104 in the I/O region 12 is removed. Therefore, a positive proximity distance value is obtained in the I/O region and the break down voltage ($V_{bd}$) of the second gate stack structures 504 is improved.

In some embodiments, by forming a thinner film 510 over the fin structure 104 in the core region 11, more of the fin structure 104 in the core region 11 is removed than in the I/O region 12. Therefore, a negative proximity distance value is obtained and the gate leakage current ($I_{gi}$) of the first gate stack structures 502 is improved.

In an embodiment, a device includes: a substrate having a core region and an I/O region; an isolation structure over the substrate; a first etched fin structure formed in the core region, and a second etched fin structure formed in the I/O region, the first etched fin structure being a continuous semiconductor structure extending continuously above the isolation structure, the second etched fin structure being a continuous semiconductor structure extending continuously above the isolation structure; and a plurality of gate stack structures formed over the first etched fin structure and the second etched fin structure, the gate stack structures each having a first width, a width of the first etched fin structure being smaller than the first width, a width of the second etched fin structure being greater than the first width.

In some embodiments of the device, the first etched fin structure has a narrowest portion, and a horizontal distance between an edge of the gate stack structures and the narrowest portion of the first etched fin structure is in a range from about −50 nm to about 0 nm. In some embodiments of the device, the second etched fin structure has a narrowest portion, and a horizontal distance between an edge of the gate stack structures and the narrowest portion of the second etched fin structure is in a range from about 0 to about 50 nm. In some embodiments of the device, a pattern density of the gate stack structures in the core region is greater than a pattern density of the gate stack structures in the I/O region. In some embodiments, the device further includes: a plurality of epitaxial structures formed adjacent to the first etched fin structure and the second etched fin structure, the epitaxial structures each having a pentagon-like shape, an interface between an epitaxial structure and the first etched fin structure is lower than a top surface of the isolation structure. In some embodiments of the device, the epitaxial structures each include a bottom surface and a first surface adjoined to the bottom surface, an angle between the bottom surface and the first surface being in a range from about 90 degrees to about 175 degrees.

In an embodiment, a device, includes: a substrate having a core region and an I/O region; a first etched fin structure with a second length formed in the core region of the substrate, and a second etched fin structure with a third length formed in the I/O region of the substrate; and a plurality of gate stack structures with a first length formed over the first etched fin structure and the second etched fin structure, where a first proximity distance value is less than zero, the first proximity distance value being defined by ($L_2-L_1$)/2, where $L_2$ is the second length and $L_1$ is the first length.

In some embodiments of the device, a second proximity distance value is greater than zero, the second proximity distance value being defined by ($L_3-L_1$)/2, where $L_3$ is the third length. In some embodiments of the device, the second proximity distance value is in a range from about 0 nm to about 50 nm. In some embodiments of the device, the first proximity distance value is in a range from about −50 nm to about 0 nm. In some embodiments, the device further includes: an isolation structure formed on the substrate, where the first etched fin structure and the second etched fin structure are embedded in the isolation structure; and a plurality of epitaxial structures formed adjacent to the first etched fin structure and the second etched fin structure, the epitaxial structures having a pentagon-like shape, an interface between an epitaxial structure and the first etched fin structure being lower than a top surface of the isolation structure.

In an embodiment, a device includes: a substrate having a core region and an I/O region; isolation structures over the substrate; a fin extending from between neighboring isolation structures, the fin having a first channel region in the core region of the substrate and a second channel region in the I/O region of the substrate, the first channel region having a first width, the second channel region having a second width; a first gate structure over the first channel region of the fin, the first gate structure having a third width, the first width being less than the third width; and a second gate structure over the second channel region of the fin, the second gate structure having the third width, the second width being greater than the third width.

In some embodiments of the device, a first proximity distance value is less than zero, the first proximity distance value being defined by ($L_2-L_1$)/2, where $L_2$ is the first width and L1 is the third width. In some embodiments of the device, a second proximity distance value is greater than zero, the second proximity distance value being defined by ($L_3-L_1$)/2, where $L_3$ is the second width and L1 is the third width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a substrate having a core region and an I/O region;
isolation regions over the substrate;
a first fin extending from between neighboring isolation regions, the first fin having a first channel region in the core region of the substrate and a second channel region in the I/O region of the substrate, the first channel region having a first length, the second channel region having a second length;
a first gate structure over the first channel region of the first fin, the first gate structure having a third length, the first length being less than the third length, the second length being greater than the third length; and a second gate structure over the second channel region of the first fin, the second gate structure having the third length.

2. The device of claim 1, wherein a difference between the first length and the third length is from 0 nm to 100 nm.

3. The device of claim 1, wherein a difference between the second length and the third length is from 0 nm to 100 nm.

4. The device of claim 1 further comprising:
a plurality of first gate structures over the first fin, the first gate structure being one of the plurality of first gate structures, the plurality of first gate structures having a first pitch; and
a plurality of second gate structures over the first fin, the second gate structure being one of the plurality of second gate structures, the plurality of second gate structures having a second pitch, the second pitch being greater than the first pitch.

5. The device of claim 1 further comprising:
a first gate spacer adjacent a first sidewall of the first gate structure;
a first source/drain region in the first fin adjacent the first gate spacer, the first source/drain region extending completely beneath the first gate spacer;
a second gate spacer adjacent a second sidewall of the first gate structure; and
a second source/drain region in the first fin adjacent the second gate spacer, the second source/drain region extending completely beneath the second gate spacer.

6. The device of claim 5, wherein the first length is measured between the closest facing surfaces of the first source/drain region and the second source/drain region, and the third length is measured between the first gate spacer and the second gate spacer.

7. The device of claim 5, wherein the first source/drain region and the second source/drain region each have five sides.

8. The device of claim 5, wherein the first source/drain region and the second source/drain region each have a bottom surface and a first surface adjoined to the bottom surface, an angle between the bottom surface and the first surface being from about 90 degrees to about 175 degrees.

9. The device of claim 1 further comprising:
a first gate spacer adjacent a first sidewall of the second gate structure;
a first source/drain region in the first fin adjacent the first gate spacer, the first source/drain region extending partially beneath the first gate spacer;
a second gate spacer adjacent a second sidewall of the second gate structure; and
a second source/drain region in the first fin adjacent the second gate spacer, the second source/drain region extending partially beneath the second gate spacer.

10. The device of claim 9, wherein the second length is measured between the closest facing surfaces of the first source/drain region and the second source/drain region, and the third length is measured between the first gate spacer and the second gate spacer.

11. The device of claim 1 further comprising:
a second fin extending from between neighboring isolation regions, the second fin having a third channel region in the core region of the substrate and a fourth channel region in the I/O region of the substrate, the third channel region having the first length, the fourth channel region having the second length, the first gate structure being disposed over the third channel region of the second fin, the second gate structure being disposed over the fourth channel region of the second fin.

12. A device comprising:
a substrate having a core region and an I/O region;
isolation regions over the substrate;
a fin extending from between neighboring isolation regions, the fin having a first portion in the core region and a second portion in the I/O region;
a first gate structure over the first portion of the fin;
a first pair of gate spacers on opposite sidewalls of the first gate structure, the first pair of gate spacers being separated by a first distance;
a first pair of source/drain regions adjacent the first pair of gate spacers, the first pair of source/drain regions being separated by a second distance, the second distance being less than the first distance;
a second gate structure over the second portion of the fin; and
a second pair of gate spacers on opposite sidewalls of the second gate structure, the second pair of gate spacers being separated by the first distance; and
a second pair of source/drain regions adjacent the second pair of gate spacers, the second pair of source/drain regions being separated by a third distance, the third distance being greater than the first distance.

13. The device of claim 12, wherein a difference between the first distance and the third distance is from 0 nm to 100 nm.

14. The device of claim 12, wherein a difference between the second distance and the third distance is from 0 nm to 100 nm.

15. The device of claim 12, wherein the first pair of source/drain regions extend completely beneath the first pair of gate spacers and partially beneath the first gate structure.

16. The device of claim 15, wherein the second pair of source/drain regions extend partially beneath the second pair of gate spacers.

17. A device comprising:
a substrate;
a fin extending from the substrate;
an isolation structure surrounding the fin, the fin being a continuous semiconductor structure extending continuously above the isolation structure;
a first gate structure formed over a first channel region of the fin, the first channel region having a first length;
a first pair of gate spacers on opposite sidewalls of the first gate structure, the first pair of gate spacers being separated by a first distance, the first length being less than the first distance;
a second gate structure formed over a second channel region of the fin, the second channel region having a second length; and
a second pair of gate spacers on opposite sidewalls of the second gate structure, the second pair of gate spacers being separated by the first distance, the second length being greater than the first distance.

18. The device of claim 17 further comprising:
a first pair of source/drain regions adjacent the first pair of gate spacers; and
a second pair of source/drain regions adjacent the second pair of gate spacers.

19. The device of claim 18, wherein the first pair of source/drain regions extend completely beneath the first pair of gate spacers and partially beneath the first gate structure.

20. The device of claim 18, wherein the second pair of source/drain regions extend partially beneath the second pair of gate spacers.

\* \* \* \* \*